(12) United States Patent
Ruoff et al.

(10) Patent No.: US 11,422,470 B2
(45) Date of Patent: Aug. 23, 2022

(54) IMAGING OPTICAL UNIT FOR EUV MICROLITHOGRAPHY

(71) Applicant: Carl Zeiss SMT GmbH, Oberkochen (DE)

(72) Inventors: Johannes Ruoff, Aalen (DE); Hubert Holderer, Oberkochen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 149 days.

(21) Appl. No.: 16/933,595

(22) Filed: Jul. 20, 2020

(65) Prior Publication Data

US 2020/0348602 A1    Nov. 5, 2020

Related U.S. Application Data

(63) Continuation of application No. PCT/EP2019/050056, filed on Jan. 3, 2019.

(30) Foreign Application Priority Data

Jan. 25, 2018 (DE) .................. 102018201170.2

(51) Int. Cl.
    *G03F 7/20*    (2006.01)
(52) U.S. Cl.
    CPC .......... *G03F 7/70233* (2013.01); *G03F 7/702* (2013.01); *G03F 7/70033* (2013.01); *G03F 7/70075* (2013.01)
(58) Field of Classification Search
    None
    See application file for complete search history.

(56) References Cited

U.S. PATENT DOCUMENTS

| 5,353,322 | A   | 10/1994 | Bruning et al. |
| 6,081,578 | A   | 6/2000  | Braat |
| 6,859,515 | B2  | 2/2005  | Schultz et al. |
| 9,377,608 | B2  | 6/2016  | Wolf |
| 9,658,533 | B2  | 5/2017  | Ruoff et al. |
| 9,678,439 | B2  | 6/2017  | Saenger et al. |
| 2007/0058269 | A1 | 3/2007 | Mann et al. |
| 2014/0038110 | A1* | 2/2014 | Mann ............. G02B 17/0663 359/364 |
| 2015/0160561 | A1* | 6/2015 | Saenger .......... G03F 7/70083 359/350 |
| 2018/0074303 | A1* | 3/2018 | Schwab .......... G02B 27/18 |

FOREIGN PATENT DOCUMENTS

| DE | 10 2008 009 600 A1 | 8/2009 |
| DE | 10 2010 041 623 A1 | 3/2012 |
| DE | 10 2011 076 752 A1 | 12/2012 |
| DE | 10 2011 086 345    | 5/2013 |
| DE | 10 2012 216 502 A1 | 3/2014 |
| DE | 10 2016 218 996 A1 | 9/2017 |
| WO | WO 2016/166080 A1  | 10/2016 |

OTHER PUBLICATIONS

German Examination Report, with translation thereof, for corresponding DE Appl No. 10 2018 201 170.2, dated Oct. 4, 2018.
Translation of International Search Report for corresponding PCT Appl No. PCT/EP2019/050056, dated Apr. 12, 2019.

* cited by examiner

*Primary Examiner* — Michelle M Iacoletti
(74) *Attorney, Agent, or Firm* — Fish & Richardson P.C.

(57) ABSTRACT

An imaging optical unit for EUV microlithography is configured so that, when used in an optical system for EUV microlithography, relatively high EUV throughput and high imaging quality can achieved.

20 Claims, 4 Drawing Sheets

IMAGING OPTICAL UNIT FOR EUV MICROLITHOGRAPHY

CROSS-REFERENCE TO RELATED APPLICATIONS

The present application is a continuation of, and claims benefit under 35 USC 120 to, international application PCT/EP2019/050056, filed Jan. 3, 2019, which claims benefit under 35 USC 119 of German Application No. 10 2018 201 170.2, filed Jan. 25, 2018. The entire disclosure of these applications are incorporated by reference herein.

FIELD

The disclosure relates to an imaging optical unit for EUV microlithography. Furthermore, the disclosure relates to an optical system including such an imaging optical unit, a projection exposure apparatus including such an optical system, a method for producing a microstructured or nanostructured component using such a projection exposure apparatus, and a microstructured or nanostructured component produced by the method.

BACKGROUND

By way of example, an imaging optical unit for EUV microlithography is known from WO 2016/166 080 A1, DE 10 2011 076 752 A1, U.S. Pat. Nos. 6,081,578, 5,353,322 and 9,678,439 B2.

SUMMARY

The present disclosure seeks to provide an imaging optical unit with which an optical system for EUV microlithography can be equipped with both a relatively high EUV throughput and a high imaging quality.

In a general aspect, the disclosure provides an imaging optical unit for EUV microlithography, which includes a plurality of mirrors that image an object field in an object plane into an image field in an image plane. In so doing, the plurality of mirrors guides imaging light along an imaging light beam path. At least one of the mirrors is embodied as a mirror for grazing incidence. A first mirror in the imaging light beam path is disposed in an object plane mirror half space with respect to the object plane. A last mirror in the imaging light beam path is disposed in an image plane mirror half space with respect to the image plane. The object plane mirror half space opens into an object plane mirror half space direction which is specified by the direction of a normal of the object plane emanating from the object plane, which normal extends into the object plane mirror half space. The image plane mirror half space opens into an image plane mirror half space direction which is specified by the direction of a normal of the image plane emanating from the image plane, which normal extends into the image plane mirror half space. There is a half space direction angle of less than 30° between the object plane mirror half space direction and the image plane mirror half space direction.

In a general aspect, the disclosure provides an imaging optical unit for EUV microlithography, which includes a plurality of mirrors that image an object field in an object plane into an image field in an image plane. In so doing, the plurality of mirrors guides imaging light along an imaging light beam path. An imaging light beam section extends between the object field and a first mirror in the imaging light beam path at an angle with respect to a normal of the object plane of less than 3°. The first mirror in the imaging light beam path is disposed in an object plane mirror half space with respect to the object plane. A last mirror in the imaging light beam path is disposed in an image plane mirror half space with respect to the image plane. The object plane mirror half space opens into an object plane mirror half space direction which is specified by the direction of a normal of the object plane emanating from the object plane, which normal extends into the object plane mirror half space. The image plane mirror half space opens into an image plane mirror half space direction which is specified by the direction of a normal of the image plane emanating from the image plane, which normal extends into the image plane mirror half space. There is a half space direction angle of less than 30° between the object plane mirror half space direction and the image plane mirror half space direction. Optionally, imaging optical unit may use a substantially perpendicular imaging light beam path to the object field and emanating from the object field, i.e., with perpendicular illumination of the object field, and so the angle with respect to the normal of the object plane is exactly 0°. An illumination of the object field with a correspondingly small angle of incidence of less than 3° can facilitate a high image-side numerical aperture with an absolute imaging/reduction scale of no more than 8×, for example, even in the case of a reflecting object.

According to the disclosure, it was recognized that an imaging optical unit in which an object plane mirror half space opens in substantially the same direction as an image plane mirror half space can be designed and combined with an illumination optical unit illuminating the object field in such a way that a guidance of EUV illumination and imaging light with a high throughput can be obtained, with simultaneously having a good imaging quality of the imaging optical unit. In the case of an assembled imaging optical unit, the half spaces can open upward or, alternatively, downward. The imaging optical unit can be embodied to image a reflecting object.

The specified condition of the half space direction angle between the mirror half space directions of, firstly, the object plane and, secondly, of the image plane of less than 30° leads to a relative position of, firstly, the object field and, secondly, the image field in which the imaging light is emitted from the object field to the first mirror in one direction and then reflected by the last mirror to the image field in substantially the opposite direction. Thus, firstly, the object field and, secondly, the image field are not opposite one another in relation to an arrangement of the mirrors of the imaging optical unit but are disposed lying substantially in the same direction in relation to the mirrors of the imaging optical unit.

Figure 2:
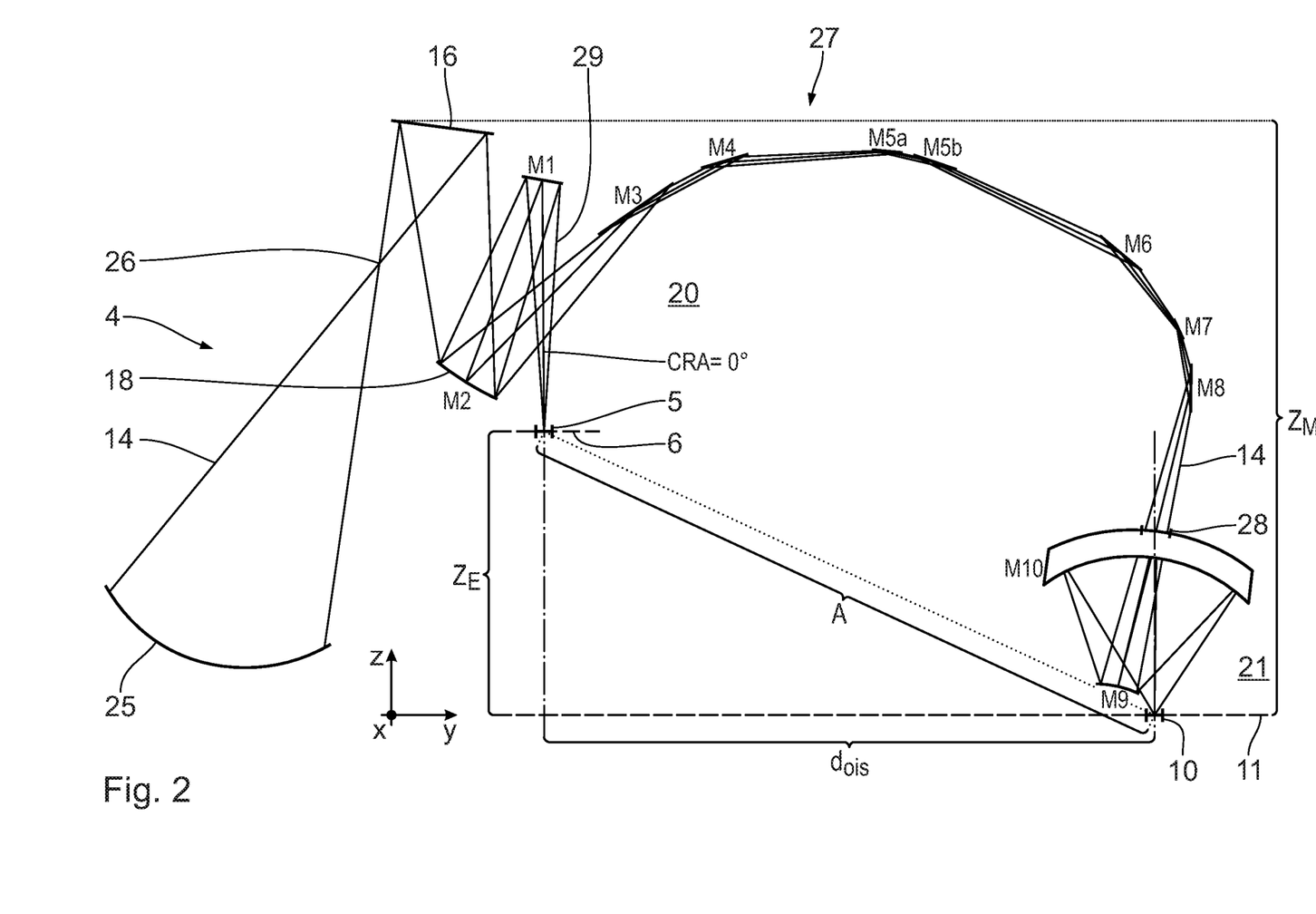
FIG. 2 shows a beam path for the imaging and illumination light within a further embodiment of a projection exposure apparatus in a meridional section, once again as far as a wafer after starting from a collector for illumination light emanating from an EUV light source.

In certain know imaging optical units, for example in an imaging optical unit according to FIG. 2 in WO 2016/166 080 A1, the object plane mirror half space opens in the negative z-direction in this FIG. 2 and the image plane mirror half space opens in the positive z-direction in this FIG. 2, and so a half space direction angle of exactly 180° is present between the two half space directions.

Embodiments implementing at least one mirror as a mirror for grazing incidence can render it possible to provide the imaging optical unit with low light losses on account of the higher reflectivity of the at least one GI mirror.

Moreover, the GI mirror can allow designing an imaging light beam path in such a way that the object field and the image field of the imaging optical unit are present with sufficient spatial separation from one another. The imaging optical unit may have more than one GI mirror and, for example, have two GI mirrors, three GI mirrors, four GI mirrors, five GI mirrors, six GI mirrors or even more GI mirrors.

The half space direction angle between the object plane mirror half space direction and the image plane mirror half space direction could be no more than 20°, could be no more than 10°, could be no more than 5° and could be exactly equal to 0.

An illumination optical unit for such an imaging optical unit can make do with few mirrors since, as a result of a corresponding structure of the light source, an odd number of mirrors of the illumination optical unit, for example exactly three mirrors, can be preferred.

In some embodiments, the object plane can extend parallel to the image plane. In such embodiments, the half space direction angle is exactly 0. The object plane can coincide with the image plane.

In some embodiments, a spatial distance between the object field and the image field can be greater than 400 mm. Such embodiments can allow housing of components, which even meet exacting demands, for conditioning an object to be disposed in the object field, for example a reticle, and an object to be disposed in the image field, for example a substrate, such a wafer. Such conditioning components can include holding and/or displacement and/or acclimatization and/or vacuum components. The distance between the object field and the image field can be greater than 450 mm, can be greater than 500 mm and can be even greater.

In some embodiments, the crossing profile can facilitate a compact mirror arrangement of the imaging optical unit.

In some embodiments, an image-side numerical aperture can facilitate a high resolution of the imaging optical unit. The image-side numerical aperture can be greater than 0.7 and can even be greater than 0.75.

An optical system disclosed herein can have advantage which correspond to those that were already explained above with reference to the imaging optical unit. To the extent that use is made of an imaging optical unit with a small angle of the imaging beam section, emanating from the first mirror, with respect to the object plane normal, i.e., with a small or even perpendicular angle of reflection of the imaging light from the object field, the illumination or imaging light can be guided in the region of the object field using optical components whose basic structure is known from U.S. Pat. No. 9,678,439 B2.

An optical system as disclosed herein can facilitate a high throughput of the EUV illumination or imaging light.

The advantages of a projection exposure apparatus disclosed herein, a production method disclosed herein, and a microstructured or nanostructured component disclosed herein can correspond to those which have already been explained above with reference to the imaging optical unit and the optical system. For example, a semiconductor chip, for example a memory chip, can be produced.

BRIEF DESCRIPTION OF THE DRAWINGS

Exemplary embodiments of the disclosure are explained in greater detail below with reference to the drawings, in which.

EXEMPLARY EMBODIMENTS OF THE DISCLOSURE

Figure 1:
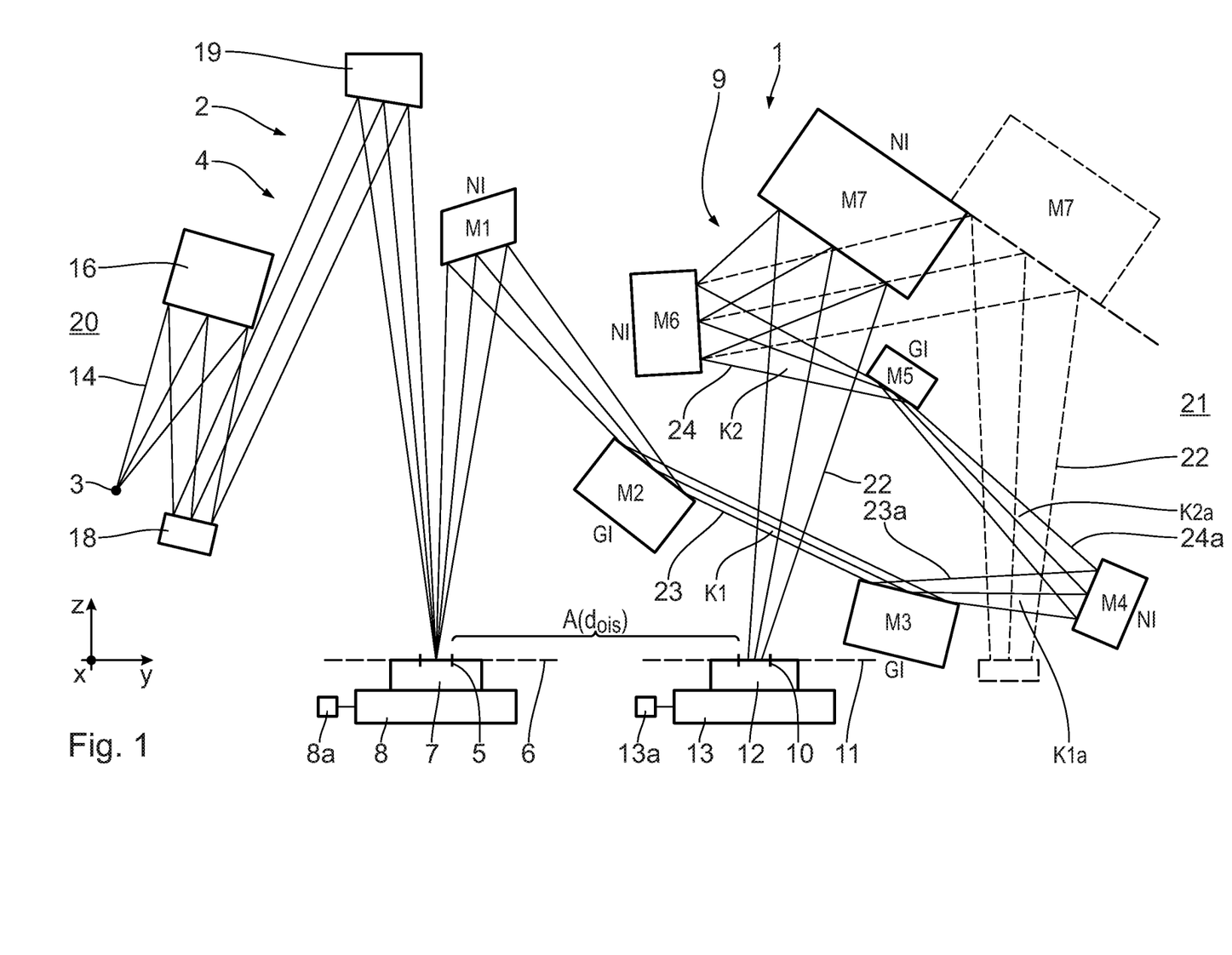
FIG. 1 very schematically shows a beam path of illumination and imaging light in a projection exposure apparatus, the components of which in this beam path between an EUV light source and a wafer as a substrate to be patterned being indicated in each case.

FIG. 1 schematically shows the components of a projection exposure apparatus 1 for microlithography in a meridional section. In this respect, reference is made to DE 10 2010 041 623 A1 and DE 10 2011 086 345.1, which, in the entirety thereof, are hereby made a part of the present application. An illumination system 2 of the projection exposure apparatus 1 includes, besides an EUV light or radiation source 3, an illumination optical unit 4 for the exposure of an object field 5 in an object plane 6. Here, a reticle 7 disposed in the object field 5 is exposed, the reticle also being referred to as a mask and being held by a reticle holder 8, only illustrated in sections, which is drivably displaceable, for example parallel to the object plane 6, by way of a reticle displacement drive 8a. The reticle 7 is embodied as reflecting reticle.

A projection optical unit 9 serves for imaging the object field 5 into an image field 10 in an image plane 11. The image plane 11 coincides with the object plane 6. A spatial distance A between the object field 5 and the image field 10 is greater than 400 mm.

A structure on the reticle 7 is imaged on a light-sensitive layer of a wafer 12 held by a wafer holder 13 that is likewise depicted schematically here, the wafer being disposed in the region of the image field 10 in the image plane 11. The latter is drivably displaceable parallel to the image plane 11, in this case by way of a wafer displacement drive 13a.

The radiation source 3 is an EUV radiation source which emits EUV radiation 14. The wavelength of the emitted used radiation of the EUV radiation source 3 lies in the range of 5 nm to 30 nm. Other wavelengths that find use in lithography and for which suitable light sources are available are also possible; the radiation source 3 can be a plasma source, for example a DPP source or an LPP source. A radiation source based on a synchrotron can also be used as a radiation source 3. Information about such a radiation source can be found by the person skilled in the art for example in U.S. Pat. No. 6,859,515 B2. A collector, not illustrated in FIG. 1, is provided for focusing the EUV radiation 14 from the EUV radiation source 3.

The EUV radiation 14 is also referred to as the illumination light or illumination radiation and as imaging light.

The illumination optical unit 4 includes a field facet mirror 16 with a multiplicity of field facets, which are not illustrated here. The field facet mirror 16 is disposed in a plane of the illumination optical unit 4 which is optically conjugate with respect to the object plane 6. The EUV radiation 14 is reflected from the field facet mirror 16 to a pupil facet mirror 18 of the illumination optical unit 4. The pupil facet mirror 18 has a multiplicity of pupil facets, which are likewise not illustrated here. With the aid of the pupil facet mirror 18, the field facets of the field facet mirror 16 are imaged into the object field 5 in a manner being superimposed on one another.

There is at least one associated pupil facet on the pupil facet mirror 18 for each field facet on the field facet mirror 16. A light channel or radiation channel is formed between respectively one field facet and respectively one pupil facet. The facets of at least one of the facet mirrors 16, 18 can have a switchable embodiment. For example, they can be disposed in a tiltable manner on the facet mirror 16, 18. Here, it is possible to embody not all of the facets but only some of the facets in a tiltable manner, for example no more than 30%, no more than 50% or no more than 70%. Provision can also be made for all facets to have a tiltable embodiment. The switchable facets are the field facets, for example. By tilting the field facets, it is possible to vary the assignment of same to the respective pupil facets and hence the formation of the light channels. A specific assignment of the field facets to the respective pupil facets is also referred to as an illumination setting. In respect of further details of the facet mirrors 16, 18 with tiltable facets, reference is made to DE 10 2008 009 600 A1.

In respect of further details of the illumination optical unit 4, reference is likewise made to DE 10 2008 009 600 A1, which describes various embodiments of such an illumination optical unit.

The illumination optical unit 4 can be embodied in such a way that it has no more than three mirrors, which successively reflect the imaging light 14, after the EUV light source 3 or after an intermediate focus disposed downstream of the latter. In the exemplary embodiment according to FIG. 1, these are the mirrors 16, 18 and a condenser 19 disposed in the illumination beam path between the pupil facet mirror 18 and the object field 5.

In order to facilitate the description of positional relationships, a Cartesian xyz-coordinate system is used hereinafter. In FIG. 1, the x-direction is perpendicular to the plane of the drawing and extends out of the latter, i.e., toward the observer. The y-direction extends toward the right in FIG. 1. The z-direction extends toward the top in FIG. 1. The object plane 6 and the image plane 11 lie parallel in the xy-plane. The reflecting or beam-guiding components of all optical components of the illumination optical unit 4 and of the projection optical unit 9 lie above the object plane 6 and the image plane 11, i.e., in the direction of positive z-coordinates.

An object-image offset $d_{ois}$ can also be used as a measure for a distance A between the object field 5 and the image field 10, the object-image offset reproducing the distance between the projections of a central object field point and a central image field point on the xy-plane. By way of example, this object-image offset $d_{ois}$ is plotted in FIG. 2.

The reticle holder 8 is displaceable in a controlled manner via the reticle displacement drive 8a in such a way that, during the projection exposure, the reticle 7 can be displaced in the object plane 6 in a displacement direction parallel to the y-direction. Accordingly, the wafer holder 13 is displaceable in a controlled manner via the wafer displacement drive 13a in such a way that the wafer 12 is displaceable in the image plane 11 in a displacement direction. As a result of this, the reticle 7 and the wafer 12 can be scanned through the object field 5 and the image field 10, respectively. The displacement direction y is also referred to as scanning direction. The displacement of the reticle 7 and of the wafer 12 in the scanning direction can preferably be carried out in a manner synchronous to one another.

The projection optical unit 9 includes a plurality of projection mirrors M1 to M7. The projection optical unit 9 could also have a different number of projection mirrors Mi and includes, such as, at least three (e.g., at least five) projection mirrors M1 to M5. For example, it can have at least six, seven or eight projection mirrors M1 to M8.

Mirrors M1 to M7 of the projection optical unit 9 image the object field 5 into the image field 10 and guide the imaging light 14 along an imaging beam path in the order of the numbering thereof in FIG. 1.

Mirrors M1, M4, M6 and M7 are embodied as mirrors with a steep angle of incidence (normal incidence mirrors; NI mirrors), wherein an angle of incidence of a chief ray of a central field point in the imaging beam path on these NI mirrors is less than 45°. Overall, the projection optical unit 9 thus has four such NI mirrors. A different number of NI mirrors is also possible, for example two NI mirrors, three NI mirrors, five NI mirrors or an even greater number of NI mirrors. The angle of incidence may be less than 30°, for example.

An image-side numerical aperture, which is specified by the last mirror M7 in the beam path of the projection optical unit 9, is not reproduced true to scale in FIG. 1 and is significantly larger than what is illustrated in FIG. 1. This image-side numerical aperture can be at least 0.4 and can be even greater and can be, for example, at least 0.5, at least 0.55 or else at least 0.6.

The mirrors M2, M3, M5 of the projection optical unit 9 are embodied as mirrors for grazing incidence (grazing incidence mirrors; GI mirrors). An angle of incidence of the chief ray of the central field point in the imaging beam path is greater than 45° and can be greater than 60°, for example, in the case of these GI mirrors. Thus, the projection optical unit 9 has a total of three GI mirrors. The projection optical unit 9 could also have a different number of GI mirrors, for example one GI mirror, two GI mirrors, four GI mirrors, five GI mirrors, six GI mirrors or an even greater number of GI mirrors.

Figure 3:
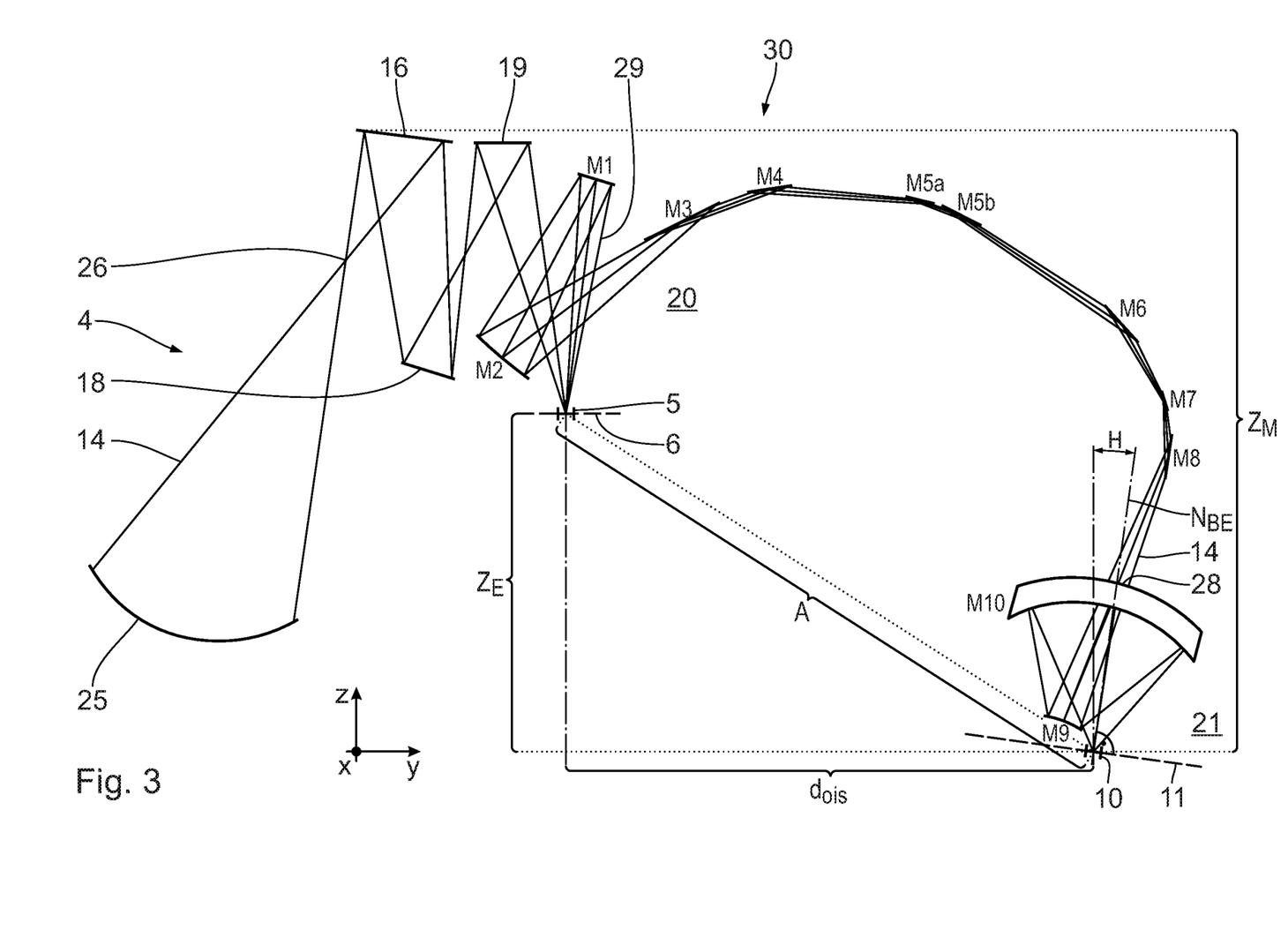
FIG. 3 shows, in an illustration similar to FIG. 2, a further embodiment of a projection exposure apparatus which, in contrast to the embodiment according to FIG. 2, illuminates a mask to be imaged not in perpendicular fashion but in oblique fashion, i.e., with an angle of incidence that differs from 0.

Instead of the mirror M5, use can also be made of a mirror pair with two GI mirrors M5a, M5b (cf. the explanations following FIGS. 2 and 3 as well).

The first mirror M1 in the imaging light beam path of the projection optical unit 9 is disposed in an object plane mirror half space 20 with respect to the object plane 6. Thus, the object plane mirror half space 20 occupies the space of positive z-coordinates of the xyz-coordinate system in FIG. 1.

The last mirror M7 of the projection optical unit 9 is disposed in the imaging light beam path in an image plane mirror half space 21 with respect to the image plane 11, the image plane mirror half space being identical with the object plane half space 20 in the embodiment of the projection exposure apparatus 1 according to FIG. 1 since the object plane 6 coincides with the image plane 11 and the mirror M7 is disposed on the same side of the object plane 6 and of the image plane 11 as the mirror M1.

An object plane mirror half space direction, into which the object plane mirror half space 20 opens, is specified by the direction of a normal of the object plane emanating from the object plane 6, which normal extends into the object plane mirror half space 20. In the exemplary embodiment according to FIG. 1, this normal extends in the z-direction, which consequently specifies the object plane mirror half space direction. Accordingly, the image plane mirror half space 21 opens into an illumination plane mirror half space direction which is specified by the direction of a normal of the image plane emanating from the image plane 11, which normal extends into the image plane mirror half space 21. On account of the fact that the object plane 6 and the image plane 11 coincide in the embodiment according to FIG. 1, the image plane mirror half space direction is once again specified by the direction of the z-axis.

The object plane mirror half space direction and the image plane mirror half space direction include a half space direction angle of less than 30° therebetween. In the exemplary embodiment according to FIG. 1, this half space direction angle is exactly 0 since the object plane mirror half space direction and the image plane mirror half space direction both extend exactly in the z-direction.

What emerges on account of the fact that the two mirror half spaces 20, 21 either open in exactly the same direction or open in directions that have an angle of less than 30° with respect to one another is that, from the view of the mask 7 and/or from the view of the wafer 12, all of the optical components of the illumination optical unit 4 and of the projection optical unit 9, or the majority thereof, are disposed on the same side of the object plane 6 and of the image plane 11. Unlike many configurations of projection optical units from the prior art, the components of the projection optical unit 9, i.e., the mirrors Mi, are not situated between the object plane 6 and the image plane 11.

Both half spaces 20, 21 open upward when the projection optical unit 9 is assembled. Alternatively, it is possible to assemble the optical system with the illumination optical unit 4 and the projection optical unit 9 in such a way that both half spaces 20, 21 open downward, and so this optical system then is assembled upside down in comparison with the arrangement according to FIG. 1.

In the projection optical unit 9 according to FIG. 1, the solid imaging light beam path extends in such a way that, between the last mirror M7 in the imaging light beam path and the image field 10, an imaging light beam section 22 crosses at least two further crossing imaging light beam sections between the first mirror M1 in the imaging light beam path and the second-to-last mirror M6 in the imaging light beam path.

In the imaging light beam path of the projection optical unit 9 illustrated using the solid line in FIG. 1, the imaging light beam section 22 crosses, firstly, a crossing imaging light beam section 23 between the second mirror M2 and the third mirror M3 in the imaging light beam path, i.e., between a sixth-to-last and fifth-to-last mirror in the imaging light beam path, and, secondly, a crossing imaging light beam section 24 between the mirror M5 and the mirror M6, i.e., between a third-to-last and a second-to-last mirror in the imaging light beam path. A crossing point K1 between the imaging light beam sections 22 and 23 is located closer to the image plane 11 than a crossing point K2 between the imaging light beam sections 22 and 24. Thus, following the reflection of the imaging light 14 at the mirror M7, the crossing point K2 is passed before the crossing point K1 in the imaging light beam path, before the imaging light 14 strikes the wafer 12 in the object field 10.

Using dashed lines, FIG. 1 indicates a variant of the projection optical unit 9 with a last mirror M7 that has been displaced in the positive y-direction. This yields a correspondingly displaced imaging light beam path, in which the imaging light beam section 22 crosses a crossing imaging light beam section 23a between the fifth-to-last mirror M3 and the fourth-to-last mirror M4 in the imaging beam path and crosses a further crossing imaging light beam section 24a between the fourth-to-last mirror M4 and the third-to-last mirror M5 in the imaging light beam path, at crossing points K1a and K2a.

A further embodiment of a projection exposure apparatus with an optical system is de-scribed below on the basis of FIG. 2, the optical system being able to be used in place of the optical system according to FIG. 1. Components and functions corresponding to those which were already explained above with reference to FIG. 1, for example, are de-noted by the same reference signs and are not discussed again.

In the projection exposure apparatus with the optical system according to FIG. 2, the illumination optical unit 4 initially has a collector 25, which collects the illumination or imaging light 14 emanating from the light source 3 not illustrated in FIG. 2. Following the reflection at the collector 25, the imaging light 14 initially passes through an intermediate focus 26 and subsequently strikes the field facet mirror 16.

In the optical system according to FIG. 2, the pupil facet mirror 18 of the illumination optical unit 4 simultaneously represents the mirror M2 of a projection optical unit 27, which is used in place of the projection optical unit 9. Such a concept of the optical system, in which the pupil facet mirror represents the second mirror of the projection optical unit at the same time, is known from U.S. Pat. No. 9,678,439 B2.

This renders it possible, as described in U.S. Pat. No. 9,678,439 B2, to ensure an angle of incidence CRA (chief ray angle) of a chief ray of a central field point of the EUV radiation 14 of 0°, i.e., perpendicular illumination of the object field 5, and hence of the reticle 7.

Following the reflection on the pupil facet mirror 18, the illumination and imaging light 14 is guided via the mirror M1 of the projection optical unit 27 to the object field 5 and impinges on the latter with CRA=0°, as described above. Subsequently, the imaging light 14 is guided over the mirrors Mi of the projection optical unit 27, in the sequence of the numbering thereof, to the image field 10. The projection optical unit 27 has a total of eleven mirrors M1 to M4, M5a, M5b and M6 to M10. The mirrors M1, M2, M9 and M10 are embodied as NI mirrors. The mirrors M3, M4, M5a, M5b, M6, M7 and M8 are embodied as GI mirrors. The last mirror M10, which specifies the imaging numerical aperture, is embodied as an obscured mirror and has a passage opening 28 for the imaging light 14 in the imaging light beam section between mirrors M8 and M9. The second-to-last mirror M9 of the projection optical unit 27 is embodied without a passage opening for the imaging light 14.

In relation to an xz-plane, which extends through the central object field point, the mirror M2 is located in one of the half spaces defined by way of this xz-plane and the mirrors M3 to M10 are located in the other half space, which is specified by way of this xz-plane that extends through the central object field point. Thus, in the arrangement according to FIG. 2, only the mirror M2 is located to the left of the object field 5 and the mirrors M3 to M10 are located to the right of the object field 5.

The mirror M1 is disposed in the object mirror half space 20. The mirror M10, i.e., the last mirror in the imaging light beam path of the projection optical unit 27, is disposed in the image plane mirror half space 21. The two mirror half spaces 20, 21 once again open in the same direction, specifically the xz-direction.

The object plane 6 lies parallel to the image plane 11 and is spaced apart from the latter in the positive z-direction. Thus, in the projection optical unit 27, the object plane mirror half space direction and the image plane mirror half space direction extend in the same direction. Accordingly, the half space direction angle is 0° again.

On account of the spacing between the object plane 6 and the image plane 11, the mirrors M9 and M10 are not located in the object plane mirror half space 20.

An imaging light beam section 29 between the object field 5 and the first mirror M1 in the imaging light beam path of the projection optical unit 27 extends at an angle of CRA=0° with respect to the normal of the object plane 6. Other angles CRA, which are less than 3°, are also possible with an arrangement of the optical system according to FIG. 2. Therefore, it is not necessary for the illumination and imaging light 14 to be reflected back onto itself within the scope of the reflection at the object field 5.

A distance $Z_E$ between the object plane 6 and the image plane 11 can be more than 10% of a maximum z-distance $Z_M$ between reflection surfaces of the optical system of the projection exposure apparatus according to FIG. 2. In the embodiment according to FIG. 2, the distance $Z_M$ is specified by the maximum distance between, firstly, the reflection surfaces of the field facet mirror 16 and, secondly, the second-to-last mirror M9 of the projection optical unit 27. In the embodiment according to FIG. 2, the ratio $Z_E$ is approximately 50%. Other distance ratios $Z_E/Z_M$ in the range between 10% and 50% are also possible, for example 15%, 20%, 25%, 30%, 35%, 40%, 45% or else distance ratios $Z_E/Z_M$ that are greater than 50%.

A further embodiment of an optical system for a projection exposure apparatus, which can be used instead of the projection exposure apparatus 1 according to FIG. 1, is described in the basis of FIG. 3 below. Components and functions corresponding to those which were already explained above with reference to FIGS. 1 and 2 have the same reference signs and are not once discussed in detail again.

In contrast to the optical system according to FIG. 2, an angle of incidence of a chief ray of a central object field point on the object plane 6, CRA, which is greater than 3° and which may be around, e.g., 6° is present in the optical system according to FIG. 3.

In the optical system according to FIG. 3, the pupil facet mirror 18 and the mirror M2 do not coincide but are two separate components, comparable with what was explained above in conjunction with the embodiment according to FIG. 1. After the pupil facet mirror 18, the illumination optical unit 4 of the optical system according to FIG. 3 still has a condenser 19 in the illumination light beam path, in accordance with the embodiment according to FIG. 1.

Apart from the different chief ray angle CRA on the object plane, a projection optical unit 30 of the optical system according to FIG. 3 corresponds to the projection optical unit 27 according to FIG. 2. This leads to an image plane 11 being tilted with respect to the object plane 6 by this difference in the angle of incidence CRA. Thus, in the optical system according to FIG. 3, the image plane 11 is no longer parallel to the object plane 6 and correspondingly not parallel to the xy-plane, with respect to which the object plane 6 is parallel. Despite this tilt of the image plane 11 with respect to the object plane 6, the first mirror M1 is located in the object plane half space 20 and the last mirror M10 of the projection optical unit 30 is located in the image plane mirror half space 21.

An object plane mirror half space direction, into which the object plane mirror half space 20 opens, is once again specified by the z-direction. An image plane mirror half space direction, into which the image plane mirror half space 21 opens, is specified in the case of the optical system according to FIG. 3 by the direction of a normal $N_{BE}$ emanating from the image plane 11, which normal extends into the image plane mirror half space 21. There is a half space direction angle H between the object plane mirror half space direction, i.e., the z-direction, and the image plane mirror half space direction, i.e., the direction of the normal $N_{BE}$, the half space direction angle being 8° in the optical system according to FIG. 3. Other such half space direction angles ranging between 0° and 30° are also possible.

An image-side numerical aperture of the projection optical units 27 and 30, respectively specified by the last mirror M10, can be greater than 0.6 (e.g., at least 0.7, at least 0.75, or even greater).

The mirrors M1 to M10 can each have a reflectivity-optimizing coating, which can be embodied as a single-layer or a multilayer coating. A corresponding multilayer coating can have a multiplicity of alternating bilayers made of two different coating materials, for example molybdenum and silicon. A single-layer coating can be embodied as a ruthenium coating, for example.

A further embodiment of an imaging optical unit or projection optical unit 31, which can be used in place of the projection optical units 9, 27 and 30 in the projection exposure apparatuses according to FIGS. 1 to 3, is described below on the basis of FIG. 4. Components and functions corresponding to those which have already been explained above with reference to FIGS. 1 to 3 bear the same reference signs and will not be discussed in detail again.

Figure 4:
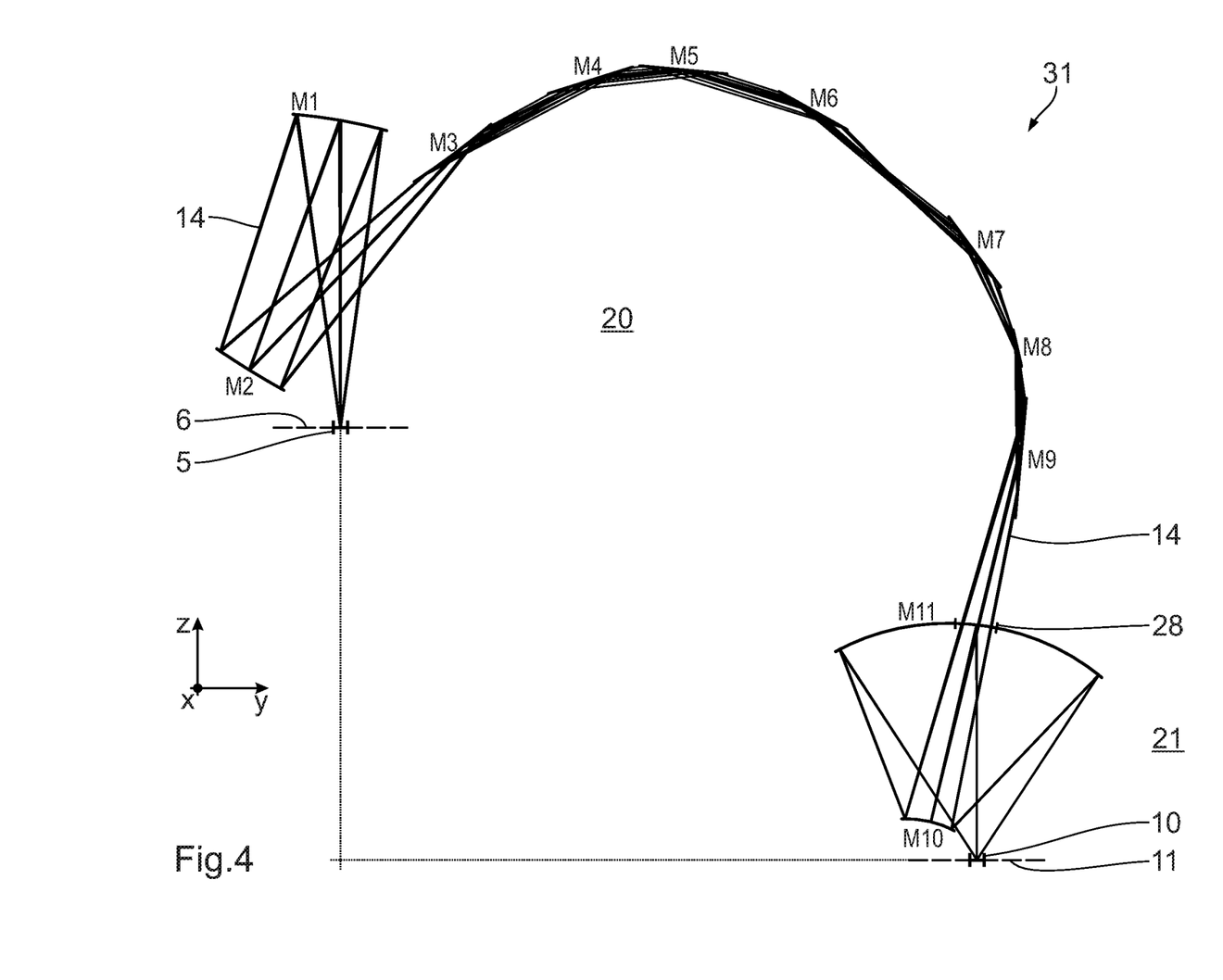
FIG. 4 schematically shows, in a meridional section, a beam path for imaging light within a further embodiment of an imaging optical unit, which can be used in the projection exposure apparatuses according to FIGS. 1 to 3 in place of the imaging optical units illustrated there.

This illustration according to FIG. 4 shows the course of individual beams which emanate from three field points spaced apart in the y-direction, with the course of a chief ray extending through a center of a pupil of the projection optical unit 31 and the course of two marginal rays being illustrated in each case.

The projection optical unit 31 also has eleven mirrors for imaging the object field 5 into the image field 10, which are numbered from M1 to M11.

Like in the embodiment according to FIG. 2, an angle of incidence CRA of the chief ray of the central field point of the imaging light 14 is 0° in the projection optical unit 31, i.e., there is a perpendicular illumination of the object field 5, and hence of the reticle 7.

The projection optical unit 31 has an image-side numerical aperture of 0.55, provided by the last mirror M11 in the imaging beam path. The projection optical unit 31 is designed for a design wavelength for the imaging light 14 of 13.5 nm. The image field has an extent of 26 mm in the x-direction and of 1.2 mm in the y-direction. The image field 10 is flat, i.e., without field curvature.

The imaging optical unit 31 has a reduction factor of 4×.

A wavefront error (rms) is 15 mλ. The imaging optical unit 31 is telecentric both on the object side and on the image side.

A stop defining both the aperture boundary on the edge and an obscuration on account of the passage opening 28 in a pupil plane, which stop therefore serves simultaneously as an aperture stop and an obscuration stop, is located directly on the second mirror M2 in the imaging beam path of the imaging light 14.

The mirrors M1 to M11 are embodied as free-form surfaces which cannot be described by a rotationally symmetric function. Other embodiments of the projection optical unit 7, in which at least one of the mirrors M1 to M11 is embodied as a rotationally symmetric asphere, are also possible. An asphere equation for such a rotationally symmetric asphere is known from DE 10 2010 029 050 A1. It is also possible for all mirrors M1 to M11 to be embodied as such aspheres.

A free-form surface can be described by the following free-form surface equation (Equation 1):

$$Z = \frac{c_x x^2 + c_y y^2}{1 + \sqrt{1 - (1+k_x)(c_x x)^2 - (1+k_y)(c_y y)^2}} + \\ C_1 x + C_2 y + C_3 x^2 + C_4 xy + C_5 y^2 + C_6 x^3 + \ldots + \\ C_9 y^3 + C_{10} x^4 + \ldots + C_{12} x^2 y^2 + \ldots + C_{14} y^4 + C_{15} x^5 + \\ \ldots + C_{20} y^5 + C_{21} x^6 + \ldots + C_{24} x^3 y^3 + \ldots + C_{27} y^6 + \ldots \quad (1)$$

The following applies to the parameters of this Equation (1):

Z is the sagittal height of the free-form surface at the point x, y, where $x^2+y^2=r^2$. Here, r is the distance from the reference axis of the free-form surface equation (x=0; y=0).

In the free-form surface Equation (1), $C_1$, $C_2$, $C_3$ ... denote the coefficients of the freeform surface series expansion in powers of x and y.

In the case of a conical base area, $c_x$, $c_y$ is a constant corresponding to the vertex curvature of a corresponding asphere. Thus, $c_x=1/R_x$ and $c_y=1/R_y$ applies. $k_x$ and $k_y$ each correspond to a conical constant of a corresponding asphere. Thus, Equation (1) describes a biconical free-form surface.

An alternatively possible free-form surface can be produced from a rotationally symmetric reference surface. Such free-form surfaces for reflection surfaces of the mirrors of projection optical units of microlithographic projection exposure apparatuses are known from US 2007-0058269 A1.

Alternatively, free-form surfaces can also be described with the aid of two-dimensional spline surfaces. Examples for this are Bezier curves or non-uniform rational basis splines (NURBS). By way of example, two-dimensional spline surfaces can be described by a grid of points in an xy-plane and associated z-values, or by these points and gradients associated therewith. Depending on the respective type of the spline surface, the complete surface is obtained by interpolation between the grid points using for example polynomials or functions which have specific properties in respect of the continuity and differentiability thereof. Examples for this are analytical functions.

The optical design data of the reflection surfaces of the mirrors M1 to M11 of the projection optical unit 31 can be gathered from the following tables. These optical design data in each case proceed from the image plane 11, i.e. describe the respective projection optical unit in the reverse propagation direction of the imaging light 14 between the image plane 11 and the object plane 6.

The first of these tables provides an overview of the design data of the projection optical unit 31 and summarizes the numerical aperture NA, the calculated design wavelength for the imaging light 14, the dimensions of the image field 10 in the x-direction and y-direction, and image field curvature. This curvature is defined as the inverse radius of curvature of the field.

The second of these tables indicates vertex point radii (Radius_x=$R_x$, Radius_y=$R_y$) and refractive power values (Power_x, Power_y) for the optical surfaces of the optical components. Negative radii values denote curves that are concave toward the incident illumination light 14 at the intersection of the respective surface with the considered plane (xz, yz) that is spanned by a surface normal at the vertex point with the respective direction of curvature (x, y). The two radii Radius_x, Radius_y may have explicitly different signs.

The vertices at each optical surface are defined as points of incidence of a guide ray which travels from an object field center to the image field 11 along a plane of symmetry x=0, i.e., the plane of the drawing of FIG. 4 (meridional plane).

The refractive powers Power_x ($P_x$, Power_y ($P_y$) at the vertex points are defined as:

$$P_x = -\frac{2 \cos AOI}{R_x}$$

$$P_y = -\frac{2}{R_y \cos AOI}$$

Here, AOI denotes an angle of incidence of the guide ray with respect to the surface normal.

The third table indicates for the mirrors M1 to M11 in mm the conic constants $k_x$ and $k_y$, the vertex point radius $R_x$ (=Radius_x) and the free-form surface coefficients $C_n$. Coefficients $C_n$ that are not tabulated have the value 0 in each case.

The fourth table also indicates the magnitude along which the respective mirror, proceeding from a reference surface, was decentered (DCY) in the y-direction, and displaced (DCZ) and tilted (TLA, TLB, TLC) in the z-direction. This corresponds to a parallel shift and a tilting in the case of the free-form surface design method. Here, a displacement is carried out in the y-direction and in the z-direction in mm, and tilting is carried out about the x-axis, about the y-axis and about the z-axis. In this case, the angle of rotation is specified in degrees. Decentering is carried out first, followed by tilting. The reference surface during decentering is in each case the first surface of the specified optical design data. Decentering in the y-direction and in the z-direction is also specified for the object field 5.

| Table 1 for FIG. 4 | |
|---|---|
| Name | |
| NA | 0.55 |
| Wavelength | 13.5 nm |
| Field_dimension_x | 26.0 mm |
| Field_dimension_y | 1.2 mm |
| Field_curvature | 0.0 1/mm |

| Table 2 for FIG. 4 | | | | | |
|---|---|---|---|---|---|
| Surface | Radius_x[mm] | Power_x[1/mm] | Radius_y[mm] | Power_y[1/mm] | Mode of operation |
| M11 | −756.9467624 | 0.0026233 | −693.9682345 | 0.0029027 | REFL |
| M10 | 1026.5546115 | −0.0019482 | 378.2678915 | −0.0052873 | REFL |
| M9 | 2988.9044714 | −0.0001005 | 18635.1528610 | −0.0007147 | REFL |

-continued

Table 2 for FIG. 4

| Surface | Radius_x[mm] | Power_x[1/mm] | Radius_y[mm] | Power_y[1/mm] | Mode of operation |
|---|---|---|---|---|---|
| M8 | 335314.5538635 | −0.0000011 | −5468.1379836 | 0.0020516 | REFL |
| M7 | −1336.4567198 | 0.0003589 | −1555.2553836 | 0.0053621 | REFL |
| M6 | −1132.7932542 | 0.0002988 | −3891.7536502 | 0.0030367 | REFL |
| M5 | −1521.8444738 | 0.0002745 | −7352.7144952 | 0.0013021 | REFL |
| M4 | −1262.4278499 | 0.0003293 | 15656.0241412 | −0.0006146 | REFL |
| M3 | −2908.2841528 | 0.0000959 | 2743.1099063 | −0.0052288 | REFL |
| M2 | 2396.7576153 | −0.0008157 | −3041.0477740 | 0.0006728 | REFL |
| M1 | −1467.1820756 | 0.0013429 | −1439.7941565 | 0.0014101 | REFL |

Table 3a for FIG. 4

| Coefficient | M11 | M10 | M9 |
|---|---|---|---|
| KY | 0.00000000 | 0.00000000 | 0.00000000 |
| KX | 0.00000000 | 0.00000000 | 0.00000000 |
| RX | −756.94676240 | 1026.55461200 | 2988.90447100 |
| C2 | 0.00325052601 | −0.0185315282 | 0.00456356417 |
| C3 | −1.37670119e−06 | 4.75378668e−06 | 3.06419328e−05 |
| C5 | −1.57518394e−05 | 0.000528151013 | −5.54249069e−05 |
| C7 | −1.75091951e−08 | 1.90333931e−06 | −2.57920193e−07 |
| C9 | 1.99195814e−09 | 4.53182799e−07 | −9.73197093e−08 |
| C10 | −5.01197411e−11 | 2.20490738e−09 | 4.14663974e−10 |
| C12 | −1.04478485e−10 | 1.24129006e−08 | −6.4216962e−10 |
| C14 | −4.52593414e−11 | 8.21502092e−09 | −4.47397877e−10 |
| C16 | −1.45021211e−14 | 1.42670028e−11 | −2.43720792e−13 |
| C18 | −2.51794779e−14 | 2.98395365e−11 | −1.87947072e−12 |
| C20 | −9.4454907e−16 | 2.09430675e−11 | −2.283886e−12 |
| C21 | −1.01685877e−16 | 1.5166695e−14 | 3.04910964e−17 |
| C23 | −3.2139507e−16 | 1.41485135e−13 | −3.54146117e−15 |
| C25 | −3.17696194e−16 | 3.48250878e−13 | −7.93302631e−15 |
| C27 | −9.34052953e−17 | 3.1989133e−13 | −1.13750492e−14 |
| C29 | −2.94012057e−20 | 1.19487528e−16 | −7.33923503e−18 |
| C31 | −8.77600474e−20 | 5.16965852e−16 | −8.97270914e−18 |
| C33 | −5.91310283e−20 | 8.23013894e−16 | −3.79644691e−17 |
| C35 | 9.07342008e−21 | −4.31727504e−15 | −5.42582637e−17 |
| C36 | −1.25812988e−22 | 1.33221946e−19 | 9.37626826e−20 |
| C38 | −6.3110518e−22 | 1.42773592e−18 | 2.49994776e−19 |
| C40 | −1.03800553e−21 | 3.25409946e−18 | 8.93256098e−20 |
| C42 | −6.9665674e−22 | −2.34740548e−17 | −2.31082317e−19 |
| C44 | −1.52319585e−22 | −3.6443614e−17 | −3.07267999e−19 |
| C46 | −7.41247465e−26 | 2.60075491e−21 | −2.27412869e−21 |
| C48 | −2.5776936e−25 | 3.10297632e−20 | −2.80686396e−21 |
| C50 | −3.28814059e−25 | 7.55851078e−20 | −8.88756713e−22 |
| C52 | −4.65115003e−26 | −1.11343577e−19 | −1.96005107e−21 |
| C54 | −4.26380734e−26 | 4.5402163e−19 | −2.15677974e−21 |
| C55 | −1.51091067e−27 | 2.34055911e−25 | −9.50250592e−24 |
| C57 | −5.85512306e−27 | 5.02350906e−23 | −6.81895337e−23 |
| C59 | −9.96386568e−27 | 6.80054963e−22 | −5.26986807e−23 |
| C61 | −9.39950014e−27 | 3.28241758e−21 | −2.579089e−23 |
| C63 | −5.23821785e−27 | 1.16129755e−20 | −1.02924251e−23 |
| C65 | −1.31722935e−27 | 1.12331127e−20 | −9.17639532e−24 |
| C67 | 4.64219066e−31 | −6.06374021e−26 | 8.91056262e−25 |
| C69 | 1.26562054e−30 | −1.5639977e−24 | 7.59119923e−25 |
| C71 | 2.23989182e−30 | −1.24619289e−23 | 3.69945452e−25 |
| C73 | 1.04489436e−30 | −2.34443511e−23 | −1.17716995e−25 |
| C75 | −1.99572737e−31 | 3.01306901e−23 | 1.93255754e−26 |
| C77 | 2.4873769e−31 | −4.46461202e−23 | 5.33155192e−27 |
| C78 | 1.33635051e−32 | 7.17411529e−29 | −4.38405077e−28 |
| C80 | 5.56174724e−32 | −1.24626109e−27 | 8.39548784e−27 |
| C82 | 1.03491225e−31 | −4.4135398e−26 | 5.18388863e−27 |
| C84 | 1.22292546e−31 | −3.65306932e−25 | 5.93111806e−27 |
| C86 | 9.62696597e−32 | −1.20521234e−24 | 6.70088164e−28 |
| C88 | 4.8853026e−32 | −2.8353219e−24 | 1.30051963e−28 |
| C90 | 1.16309079e−32 | −1.71491039e−24 | 2.08283579e−29 |
| C92 | −5.87758981e−36 | 3.07508895e−30 | −1.0967946e−28 |
| C94 | −2.77776905e−35 | 8.31388202e−29 | −1.70269927e−28 |
| C96 | −7.3164304e−35 | 7.64977802e−28 | −5.42140072e−29 |
| C98 | −9.28287506e−35 | 3.38686975e−27 | −8.3312432e−30 |
| C100 | −4.62430682e−35 | 3.39524162e−27 | 9.90481221e−30 |
| C102 | −1.04383225e−35 | −5.48282746e−27 | −5.71166168e−30 |
| C104 | −2.79893524e−36 | 5.64406531e−29 | −2.64376824e−30 |
| C105 | −9.88233673e−38 | −1.7261832e−33 | 6.99575289e−32 |

-continued

Table 3a for FIG. 4

| Coefficient | M11 | M10 | M9 |
|---|---|---|---|
| C107 | −5.08794629e−37 | 5.48382198e−32 | 1.5891639e−32 |
| C109 | −1.16885012e−36 | 1.88722451e−30 | 1.20914695e−31 |
| C111 | −1.70919755e−36 | 2.01523209e−29 | −3.16860944e−31 |
| C113 | −1.73738865e−36 | 9.5193564e−29 | −3.24558124e−31 |
| C115 | −1.2082249e−36 | 2.27445552e−28 | 4.57450389e−32 |
| C117 | −5.14992021e−37 | 4.05467803e−28 | −5.98079996e−32 |
| C119 | −1.0250481e−37 | 1.7051789e−28 | −2.21025859e−32 |
| C121 | 2.82155804e−41 | −3.34537322e−35 | 4.09158956e−33 |
| C123 | 1.66939974e−40 | −1.27807255e−33 | 1.44211213e−32 |
| C125 | 5.13968298e−40 | −1.56469331e−32 | 2.03104401e−33 |
| C127 | 8.52481185e−40 | −9.13627612e−32 | 2.71943208e−33 |
| C129 | 7.17260666e−40 | −2.95442743e−31 | −1.54699381e−33 |
| C131 | 2.5462981e−40 | −8.73244364e−32 | 8.85981445e−35 |
| C133 | 5.14272451e−41 | 3.94754197e−31 | −2.24527756e−34 |
| C135 | 2.18871797e−41 | 2.59587986e−31 | −7.02018913e−35 |
| C136 | 3.66084152e−43 | 2.75064445e−38 | 2.65843646e−36 |
| C138 | 2.17777701e−42 | −5.81421719e−37 | −4.5388478e−35 |
| C140 | 5.75483274e−42 | −2.90939742e−35 | −5.83356633e−35 |
| C142 | 9.80558773e−42 | −3.84477691e−34 | 2.74536062e−36 |
| C144 | 1.21920596e−41 | −2.51586171e−33 | 1.36182906e−35 |
| C146 | 1.08176307e−41 | −8.12834521e−33 | −2.66266215e−36 |
| C148 | 6.7797428e−42 | −1.64335803e−32 | 4.85417775e−38 |
| C150 | 2.52943211e−42 | −2.40883915e−32 | −3.01774391e−37 |
| C152 | 4.30867129e−43 | −8.72891365e−33 | −8.16121173e−38 |
| C154 | −5.45247137e−47 | 0 | 0 |
| C156 | −3.78309875e−46 | 0 | 0 |
| C158 | −1.39610326e−45 | 0 | 0 |
| C160 | −2.99276176e−45 | 0 | 0 |
| C162 | −3.79572677e−45 | 0 | 0 |
| C164 | −2.43481356e−45 | 0 | 0 |
| C166 | −6.56242603e−46 | 0 | 0 |
| C168 | −1.00931535e−46 | 0 | 0 |
| C170 | −6.38145448e−47 | 0 | 0 |
| C171 | −5.85160979e−49 | 0 | 0 |
| C173 | −4.02478586e−48 | 0 | 0 |
| C175 | −1.22756072e−47 | 0 | 0 |
| C177 | −2.41227488e−47 | 0 | 0 |
| C179 | −3.46549197e−47 | 0 | 0 |
| C181 | −3.74321532e−47 | 0 | 0 |
| C183 | −2.89915611e−47 | 0 | 0 |
| C185 | −1.66375557e−47 | 0 | 0 |
| C187 | −5.46113051e−48 | 0 | 0 |
| C189 | −7.72825824e−49 | 0 | 0 |

Table 3b for FIG. 4

| Coefficient | M8 | M7 | M6 |
|---|---|---|---|
| KY | 0.00000000 | 0.00000000 | 0.00000000 |
| KX | 0.00000000 | 0.00000000 | 0.00000000 |
| RX | 335314.55390000 | −1336.45672000 | −1132.79325400 |
| C2 | −0.00934477002 | −0.00319931533 | −0.00924098709 |
| C3 | −5.28674539e−07 | −1.76420599e−05 | −5.77521025e−06 |
| C5 | 0.000253783415 | 1.00263195e−05 | −2.48058598e−05 |
| C7 | −6.82771579e−07 | −1.65734802e−07 | −1.00876904e−08 |
| C9 | 6.31363484e−07 | 3.14468114e−07 | −1.21324764e−07 |
| C10 | 7.70009917e−10 | −1.51407885e−10 | 1.43554678e−10 |
| C12 | −4.20478233e−10 | 1.13440214e−09 | −4.22848947e−10 |
| C14 | 2.77198568e−09 | −7.7708489e−10 | 2.20823534e−10 |
| C16 | −4.43361749e−12 | 8.38735197e−13 | −4.50109714e−13 |
| C18 | −2.07561905e−11 | −4.65185261e−12 | 1.76767547e−13 |
| C20 | 6.5541556e−12 | 2.69958641e−12 | −1.15250337e−12 |
| C21 | 6.13104877e−15 | 4.76090065e−16 | −5.08513478e−16 |
| C23 | 6.75105487e−14 | −6.86107077e−15 | 4.47674693e−16 |
| C25 | 8.54516082e−14 | 1.77013918e−14 | −2.76455936e−15 |
| C27 | 1.04404202e−13 | −1.31571735e−14 | 2.54210161e−15 |
| C29 | −1.06315028e−16 | −6.62502022e−18 | 1.01298466e−18 |
| C31 | −7.15151455e−16 | 4.81457319e−17 | −5.48520419e−18 |
| C33 | −7.67567294e−16 | −9.49830761e−17 | 1.50722911e−17 |
| C35 | −1.19920577e−16 | 4.60964936e−17 | −1.13668406e−16 |
| C36 | 5.31562538e−20 | −3.13756534e−21 | 6.04583024e−22 |
| C38 | 1.69007629e−18 | 4.87008386e−20 | −9.28288968e−21 |
| C40 | −3.32578007e−19 | −3.09626922e−19 | 4.5511045e−20 |
| C42 | −1.27052849e−17 | 6.65762777e−19 | −2.96163741e−20 |
| C44 | 1.53403729e−17 | 1.38470765e−19 | 6.41344709e−19 |
| C46 | −2.75616307e−21 | 3.35346413e−23 | −6.9892699e−25 |
| C48 | 1.50480725e−20 | −4.6569225e−22 | 7.13009691e−23 |
| C50 | 1.44516638e−19 | 2.332696e−21 | 2.59714278e−22 |
| C52 | −5.1390504e−20 | −3.4726867e−21 | −8.03142253e−22 |
| C54 | 3.87854384e−19 | 4.470418e−21 | 2.40034346e−20 |
| C55 | 3.75342753e−24 | −1.98492517e−25 | 1.18040293e−26 |
| C57 | 4.27516608e−23 | −5.19028749e−25 | 8.11061947e−26 |
| C59 | −1.57464385e−23 | 4.46959627e−24 | −9.2971759e−26 |
| C61 | 1.67934488e−21 | −1.3352712e−23 | −4.77329015e−24 |
| C63 | 1.09671639e−20 | −9.33716012e−24 | 1.43217969e−23 |
| C65 | −1.44543057e−20 | −6.29203846e−23 | −3.0965402e−23 |
| C67 | 4.08789122e−26 | 8.61352897e−28 | −7.31012016e−29 |
| C69 | −1.66977787e−24 | 6.42752536e−27 | −7.16391228e−28 |
| C71 | −2.17957504e−23 | −5.05714323e−26 | −8.90285198e−27 |
| C73 | −1.67662776e−22 | 5.34645152e−26 | −9.67772685e−26 |
| C75 | 7.40895888e−23 | 1.13680338e−25 | 2.65578316e−25 |
| C77 | −2.47543364e−22 | −7.36972753e−25 | −3.35082658e−24 |
| C78 | −1.42425862e−28 | 8.71063877e−30 | −1.96811187e−31 |
| C80 | −4.62835474e−27 | 5.5406969e−30 | −9.54163826e−31 |
| C82 | 1.78274941e−26 | −3.81160438e−29 | −9.95828853e−30 |
| C84 | 8.43458936e−25 | 2.46353784e−28 | −6.70862883e−29 |
| C86 | −6.11794472e−25 | −4.67883125e−28 | 2.42072109e−28 |
| C88 | −1.27539398e−24 | 3.29921559e−27 | −3.68091077e−27 |
| C90 | 6.85310447e−24 | 3.50398021e−27 | −5.45637301e−27 |
| C92 | −1.67985973e−30 | −4.60174319e−32 | 4.87317962e−34 |
| C94 | 7.07234276e−29 | −1.98663483e−31 | 4.00220396e−33 |
| C96 | −3.72466267e−28 | 1.08736804e−30 | −3.24422091e−32 |
| C98 | 4.48202693e−27 | −2.23137944e−30 | 1.19842994e−30 |
| C100 | 4.78418354e−26 | 9.40746235e−30 | 8.16974556e−30 |
| C102 | −4.2518919e−26 | −3.01713122e−29 | −5.05373933e−29 |
| C104 | 3.9685556e−26 | 8.37373732e−29 | 2.26636758e−28 |
| C105 | 2.15793431e−33 | −1.46943869e−34 | −1.31330079e−37 |
| C107 | 2.77240339e−31 | 1.71102468e−34 | 1.04034954e−35 |
| C109 | 1.55553711e−30 | 6.953809e−34 | 9.29006679e−35 |
| C111 | −3.79640708e−29 | −1.05446996e−32 | 1.21189092e−33 |
| C113 | −2.92852127e−28 | 4.36061126e−32 | 1.18011501e−32 |
| C115 | 3.51030565e−29 | −1.2167107e−31 | 2.18403273e−32 |
| C117 | −2.29274817e−28 | −5.49243828e−32 | 1.53158932e−31 |
| C119 | −1.25884661e−27 | −3.60566281e−32 | 8.12205092e−31 |
| C121 | −4.9835303e−35 | 6.39026668e−37 | −7.49054244e−40 |
| C123 | −5.64296865e−33 | 3.19462202e−36 | −6.74381479e−39 |
| C125 | −9.30112205e−33 | −1.64139174e−35 | 1.13738118e−36 |
| C127 | 9.38289929e−31 | 6.63217275e−35 | 1.17809652e−35 |
| C129 | 1.24275202e−30 | −2.48574521e−34 | −7.25224641e−36 |
| C131 | −3.8641767e−30 | 2.85508736e−34 | −3.55107519e−35 |
| C133 | 1.15218716e−29 | 6.53662819e−34 | 3.61380722e−33 |
| C135 | 4.10277317e−30 | −3.20948537e−33 | −5.73774758e−33 |
| C136 | 6.21842361e−38 | 7.6520911e−40 | 1.15114618e−41 |
| C138 | −1.68949959e−36 | −4.47009065e−39 | −6.77224516e−41 |
| C140 | 4.74273299e−35 | −1.62510744e−38 | 5.74738217e−41 |

-continued

Table 3b for FIG. 4

| Coefficient | M8 | M7 | M6 |
| --- | --- | --- | --- |
| C142 | −2.88854175e−34 | 2.00050656e−37 | 4.06675697e−39 |
| C144 | −4.48958554e−33 | −7.86112067e−37 | 3.37781599e−38 |
| C146 | 5.41381439e−33 | 1.12478959e−36 | −2.40809456e−37 |
| C148 | 4.59135366e−33 | 2.61652129e−36 | 1.58144339e−37 |
| C150 | −4.79402894e−32 | 8.96757693e−38 | 1.1084516e−35 |
| C152 | 8.26439198e−33 | −7.16832554e−36 | −2.7485602e−35 |

Table 3c for FIG. 4

| Coefficient | M5 | M4 | M3 |
| --- | --- | --- | --- |
| KY | 0.00000000 | 0.00000000 | 0.00000000 |
| KX | 0.00000000 | 0.00000000 | 0.00000000 |
| RX | −1521.84447400 | −1262.42785000 | −2908.28415300 |
| C2 | 0.0219740073 | −0.0254785928 | −0.00518024147 |
| C3 | 1.67873801e−05 | 3.37223876e−05 | −1.54008935e−05 |
| C5 | 7.70290351e−06 | −3.99642044e−05 | 5.75103929e−05 |
| C7 | −2.5016547e−08 | −2.60807474e−07 | −1.84606952e−07 |
| C9 | 5.14855455e−08 | 2.11332745e−07 | −4.38755885e−07 |
| C10 | −1.35437128e−10 | 8.65015648e−11 | 2.02401057e−10 |
| C12 | −4.14996764e−10 | 5.02489518e−10 | −1.31723029e−10 |
| C14 | −2.41590158e−10 | −3.05573821e−10 | 7.26268815e−10 |
| C16 | 2.08808394e−13 | −8.09782428e−14 | 7.15013833e−13 |
| C18 | −4.35601519e−13 | 2.29483725e−13 | 1.26409466e−12 |
| C20 | 7.60060404e−13 | 1.31281615e−12 | 3.01323591e−13 |
| C21 | 2.46229128e−16 | −2.55632968e−16 | −6.02302942e−16 |
| C23 | −1.30814638e−15 | −1.02426425e−15 | 1.2645573e−15 |
| C25 | −6.13132831e−15 | −2.26034629e−15 | −6.6795358e−15 |
| C27 | 3.36674001e−16 | −4.99010847e−15 | −9.31923431e−16 |
| C29 | −2.15354381e−19 | −3.46101969e−18 | −3.6008001e−18 |
| C31 | −2.1574579e−18 | 1.34849042e−17 | −1.22088795e−17 |
| C33 | −3.1694303e−17 | 4.90516379e−18 | −3.53552439e−17 |
| C35 | 2.83823582e−17 | 3.94687403e−17 | −5.13594848e−17 |
| C36 | −7.05292788e−23 | 2.27345938e−21 | −3.11092637e−21 |
| C38 | 2.89593146e−21 | −2.40900889e−21 | 2.5534562e−20 |
| C40 | −2.71613589e−20 | 3.97507158e−20 | 2.36502738e−19 |
| C42 | −3.61487884e−19 | −3.92649498e−20 | 5.68353487e−19 |
| C44 | 2.93149482e−19 | −5.25605838e−20 | 4.80941096e−19 |
| C46 | −1.08268211e−23 | −3.24199121e−24 | −2.38814565e−23 |
| C48 | −2.35339207e−23 | −7.8894836e−23 | −1.7327779e−22 |
| C50 | 1.82014311e−22 | 4.62955732e−22 | −1.34928768e−21 |
| C52 | −1.0703055e−21 | 1.39462926e−21 | −3.60804049e−21 |
| C54 | 2.15196082e−21 | −5.47641275e−21 | −2.82412035e−21 |
| C55 | 6.86861049e−27 | −3.11474016e−26 | 9.14987827e−26 |
| C57 | −1.73580871e−26 | 5.25600252e−26 | −1.59236509e−25 |
| C59 | −4.06400718e−25 | −4.15811336e−24 | −1.1463791e−25 |
| C61 | 9.36251432e−25 | −2.134624e−23 | 3.13560403e−24 |
| C63 | 1.85158385e−23 | 1.27406466e−23 | 1.11446927e−23 |
| C65 | −7.03743603e−25 | 3.57688552e−23 | 2.03094339e−23 |
| C67 | 1.05127636e−28 | 1.25352976e−28 | −5.33736179e−29 |
| C69 | 9.17899941e−28 | 3.23054075e−27 | −1.85615007e−27 |
| C71 | −4.7533087e−27 | 4.88085881e−26 | −8.9644788e−28 |
| C73 | −9.13287858e−26 | 4.07682205e−26 | 1.12160196e−26 |
| C75 | 1.4293095e−25 | −4.16188198e−25 | −2.30777537e−26 |
| C77 | −6.9201048e−26 | 3.51126156e−25 | −1.45036501e−25 |
| C78 | −1.24804861e−31 | 4.71091483e−31 | −1.30140818e−30 |
| C80 | 1.23013617e−31 | −2.62465485e−30 | 7.40511051e−30 |
| C82 | 7.84946299e−30 | 3.84157604e−29 | 1.11417638e−29 |
| C84 | 7.37604676e−29 | 6.40533654e−29 | 1.99704409e−29 |
| C86 | −1.37563301e−27 | 2.76021636e−27 | 1.51838301e−28 |
| C88 | −5.35103866e−28 | 2.69244999e−27 | 1.10595999e−28 |
| C90 | −2.19749605e−28 | −4.03472828e−27 | 6.81467582e−28 |
| C92 | −3.64259479e−34 | −2.73543627e−33 | 4.36981856e−33 |
| C94 | −1.8556083e−32 | −3.8794945e−32 | 1.0096515e−31 |
| C96 | −3.99751691e−32 | −1.81462931e−30 | 1.40854747e−31 |
| C98 | 2.30502824e−30 | −1.5173947e−29 | −4.01639723e−31 |
| C100 | −7.45011546e−30 | −3.06411372e−29 | −2.09296988e−30 |
| C102 | −6.06778293e−30 | 5.25255226e−30 | −4.79766988e−31 |
| C104 | −2.02797928e−31 | −4.03104926e−30 | −1.92968377e−30 |
| C105 | 1.74447575e−36 | −2.80352743e−36 | 4.96833835e−36 |
| C107 | −3.28930997e−36 | 4.99181514e−35 | −2.30388821e−34 |
| C109 | −1.10532411e−34 | 9.07148271e−34 | −5.03664879e−34 |

-continued

Table 3c for FIG. 4

| Coefficient | M5 | M4 | M3 |
|---|---|---|---|
| C111 | −1.28004342e−33 | 1.85763912e−32 | −5.55829555e−34 |
| C113 | 1.41209408e−32 | 1.13730106e−31 | 7.06898573e−35 |
| C115 | −2.51068469e−32 | 1.30604217e−31 | 6.67232081e−33 |
| C117 | −4.87962603e−35 | −1.33108342e−31 | 1.20724267e−33 |
| C119 | −3.42092506e−33 | 2.00243079e−31 | 3.27564659e−33 |
| C121 | −9.11175034e−40 | 9.78526314e−39 | −4.76402144e−38 |
| C123 | 1.12968922e−37 | −4.50947841e−37 | −1.38407239e−36 |
| C125 | 5.01887076e−37 | −5.23699161e−36 | −3.24897631e−36 |
| C127 | −1.58515981e−35 | −7.82195066e−35 | 6.35978331e−36 |
| C129 | −1.31690353e−35 | −4.00266509e−34 | 7.54895748e−36 |
| C131 | −1.31697018e−34 | −1.74653526e−34 | −1.73454309e−36 |
| C133 | 5.8164012e−35 | 5.36109712e−34 | −1.95545657e−36 |
| C135 | −5.1029857e−36 | −9.12983797e−34 | −3.05811041e−36 |
| C136 | −8.86244634e−42 | 2.55553215e−42 | 4.09705463e−41 |
| C138 | 3.67125475e−41 | −4.08187469e−41 | 2.48939804e−39 |
| C140 | 6.84466064e−40 | 1.80889812e−39 | 9.84539628e−39 |
| C142 | 3.24985317e−39 | 4.21614038e−39 | 8.11615583e−39 |
| C144 | −6.81393015e−38 | 1.42859251e−37 | −2.54886633e−38 |
| C146 | −2.17748444e−37 | 5.25975165e−37 | 3.09077489e−40 |
| C148 | −4.25006659e−37 | −1.09944999e−37 | −2.20819356e−38 |
| C150 | −2.08877647e−38 | −6.48251681e−37 | 3.4302672e−40 |
| C152 | 3.69033651e−38 | 1.30969821e−36 | 1.20590406e−39 |

Table 3d for FIG. 4

| Coefficient | M2 | M1 |
|---|---|---|
| KY | 0.00000000 | 0.00000000 |
| KX | 0.00000000 | 0.00000000 |
| RX | 2396.75761500 | −1467.18207600 |
| C2 | 0.0009861144 | 0 |
| C3 | −1.32471892e−06 | 0 |
| C5 | −3.22512531e−06 | 0 |
| C7 | 2.60211284e−07 | −8.51199354e−08 |
| C9 | 1.5922243e−07 | −5.60253526e−08 |
| C10 | 2.30979529e−09 | −2.32025464e−11 |
| C12 | 4.15798121e−10 | −1.11483933e−10 |
| C14 | 4.83848232e−1 | 1.13968715e−10 |
| C16 | −1.89727819e−12 | 2.13553489e−15 |
| C18 | −4.85026444e−12 | 1.87437861e−13 |
| C20 | −3.3060428e−12 | 2.1994585e−13 |
| C21 | 1.96583942e−14 | −2.62366851e−17 |
| C23 | −1.31000592e−15 | −8.3941652e−17 |
| C25 | −1.56014478e−14 | −4.00022141e−16 |
| C27 | −1.99538448e−14 | 8.84019254e−16 |
| C29 | 8.69150601e−18 | 2.43460131e−20 |
| C31 | 9.33443804e−18 | 4.24759587e−20 |
| C33 | −5.44101637e−17 | −2.60369242e−18 |
| C35 | −6.53903583e−17 | 2.5308602e−17 |
| C36 | 2.04983683e−19 | −1.39838383e−21 |
| C38 | −1.11746467e−19 | −6.24868081e−21 |
| C40 | −5.71760188e−19 | −1.67703692e−20 |
| C42 | −2.21378751e−19 | 2.62161068e−22 |
| C44 | 1.20108695e−19 | −4.35547258e−20 |
| C46 | 6.29278193e−22 | 2.40152331e−23 |
| C48 | 1.91238072e−21 | 1.08316391e−22 |
| C50 | 1.46293532e−21 | 2.32574208e−22 |
| C52 | −1.96984802e−22 | 5.18466041e−22 |
| C54 | 3.15132652e−21 | −8.96760575e−22 |
| C55 | 8.85342451e−24 | 1.41365863e−25 |
| C57 | 1.63488052e−23 | 7.76420195e−25 |
| C59 | 1.18421258e−23 | 2.45358082e−24 |
| C61 | −1.08658636e−22 | 6.06306225e−24 |
| C63 | −2.10765514e−23 | 6.80860425e−24 |
| C65 | 2.21027596e−23 | 1.14870786e−23 |
| C67 | −3.51841012e−26 | −1.84603867e−27 |
| C69 | −3.49868503e−26 | −1.07883178e−26 |
| C71 | 2.998165e−25 | −2.47642458e−26 |
| C73 | 8.58242213e−26 | −4.24141461e−26 |
| C75 | 2.05959721e−25 | −7.7181693e−26 |
| C77 | 1.04319708e−25 | 4.50303217e−26 |
| C78 | 2.43938068e−28 | −8.89492415e−30 |
| C80 | 1.21740676e−27 | −5.94113101e−29 |
| C82 | −1.87514176e−27 | −2.04818012e−28 |
| C84 | −3.8786987e−27 | −5.93632828e−28 |
| C86 | 7.02432365e−27 | −1.12087376e−27 |
| C88 | 1.33922008e−27 | −1.12006364e−27 |
| C90 | −1.76118306e−27 | −1.42712591e−27 |
| C92 | −5.1467963e−31 | 7.94887765e−32 |
| C94 | 6.85921754e−30 | 5.62753203e−31 |
| C96 | 3.14955042e−29 | 1.6670079e−30 |
| C98 | 4.23711385e−29 | 2.76620742e−30 |
| C100 | 2.7121401e−29 | 4.42605024e−30 |
| C102 | 1.32314289e−29 | 6.86061959e−30 |
| C104 | −3.38425116e−29 | −2.27424368e−30 |
| C105 | 1.76008308e−33 | 3.29276353e−34 |
| C107 | 5.44390706e−32 | 2.58595983e−33 |
| C109 | 5.82158481e−32 | 1.02657943e−32 |
| C111 | −5.59130008e−32 | 3.05913579e−32 |
| C113 | −4.53096343e−31 | 7.35035847e−32 |
| C115 | −6.37108524e−31 | 1.0456151e−31 |
| C117 | −5.36487557e−31 | 9.00761349e−32 |
| C119 | −3.86472353e−32 | 9.85808779e−32 |
| C121 | 4.83457083e−35 | −1.83828936e−36 |
| C123 | −3.55980089e−34 | −1.51759121e−35 |
| C125 | −7.1977159e−34 | −5.4361518e−35 |
| C127 | 1.90268546e−33 | −1.14009345e−34 |
| C129 | −1.64419091e−35 | −1.53685536e−34 |
| C131 | 5.28696223e−33 | −2.39447901e−34 |
| C133 | −5.2029879e−33 | −3.16635328e−34 |
| C135 | 1.31133316e−33 | 1.11104394e−34 |
| C136 | 3.51778556e−38 | −6.60503723e−39 |
| C138 | −9.17291792e−38 | −5.87376514e−38 |
| C140 | −2.03734313e−36 | −2.75123813e−37 |
| C142 | −5.12240498e−37 | −8.57500779e−37 |
| C144 | −1.63361366e−35 | −2.28686329e−36 |
| C146 | 1.66545286e−36 | −4.25558622e−36 |
| C148 | −9.00644261e−36 | −4.84909875e−36 |
| C150 | 7.82432098e−36 | −3.64577172e−36 |
| C152 | 5.22574505e−36 | −3.61997763e−36 |
| C154 | −2.06610689e−39 | 1.75774314e−41 |
| C156 | −2.04374262e−39 | 1.65196011e−40 |
| C158 | −1.36778337e−38 | 6.91104629e−40 |
| C160 | 2.21986742e−38 | 1.72414768e−39 |
| C162 | 8.88757453e−38 | 2.98071839e−39 |
| C164 | 2.43966022e−37 | 3.35402181e−39 |

-continued

Table 3d for FIG. 4

| Coefficient | M2 | M1 |
| --- | --- | --- |
| C166 | −3.1289099e−37 | 5.23468463e−39 |
| C168 | 4.76639758e−37 | 5.88549291e−39 |
| C170 | 2.65697927e−38 | −2.57066341e−39 |
| C171 | 2.55122174e−43 | 5.52989344e−44 |
| C173 | 1.81870101e−41 | 5.4139575e−43 |
| C175 | 2.33158832e−42 | 2.96467481e−42 |
| C177 | 2.07645435e−40 | 1.02962481e−41 |
| C179 | −2.72919011e−40 | 2.7804227e−41 |
| C181 | −1.64669661e−40 | 6.36323085e−41 |
| C183 | 1.97192555e−39 | 9.10048005e−41 |
| C185 | 2.36540387e−39 | 9.01621558e−41 |
| C187 | 2.8442117e−39 | 5.93632157e−41 |
| C189 | 9.69654371e−41 | 5.59364422e−41 |

Table 4a for FIG. 4

| Surface | DCX | DCY | DCZ |
| --- | --- | --- | --- |
| Image | 0.00000000 | 0.00000000 | 0.00000000 |
| M11 | 0.00000000 | 0.00000000 | 658.59735966 |
| M10 | 0.00000000 | 129.86904917 | 106.36091582 |
| M9 | 0.00000000 | −127.31577135 | 1183.08975457 |
| M8 | 0.00000000 | −108.43999449 | 1439.04675030 |
| M7 | 0.00000000 | 5.20219938 | 1705.29339367 |
| M6 | 0.00000000 | 450.04822440 | 2094.83607397 |
| M5 | 0.00000000 | 852.17416364 | 2216.60599355 |
| M4 | 0.00000000 | 1125.96974524 | 2169.68463032 |
| M3 | 0.00000000 | 1429.47721413 | 2003.98048928 |
| M2 | 0.00000000 | 2041.38740910 | 1372.02067880 |
| M1 | 0.00000000 | 1786.46005601 | 2072.43484793 |
| Object | 0.00000000 | 1786.45728238 | 1211.74242378 |

Table 4b for FIG. 4

| Surface | TLA[deg] | TLB[deg] | TLC[deg] |
| --- | --- | --- | --- |
| Image | −0.00000000 | 0.00000000 | −0.00000000 |
| M11 | 6.61687125 | 0.00000000 | −0.00000000 |
| M10 | 13.33378381 | 180.00000000 | 0.00000000 |
| M9 | 94.60806581 | 0.00000000 | −0.00000000 |
| M8 | 76.33401887 | 0.00000000 | 180.00000000 |
| M7 | 54.04685456 | 0.00000000 | −0.00000000 |
| M6 | 29.02754876 | 0.00000000 | 180.00000000 |
| M5 | 3.56129750 | 0.00000000 | −0.00000000 |
| M4 | −19.17873719 | 0.00000000 | 180.00000000 |
| M3 | −37.27820273 | −0.00000000 | −0.00000000 |
| M2 | 32.03817982 | 180.00000000 | 0.00000000 |
| M1 | 9.99981536 | 0.00000000 | −0.00000000 |
| Object | −0.00018464 | 180.00000000 | 0.00000000 |

The imaging optical units 9, 27, 30, 31 can have a reduction factor of 4×, 6× or 8×. An anamorphic design of the imaging optical unit, in which the reduction factor in the xz-dimension is different to the one in the yz-dimension, is also possible.

During use of the projection exposure apparatus 1, the reticle 7 and the wafer 12, which bears a coating that is light-sensitive to the illumination light 14, are provided. Subsequently, at least one portion of the reticle 7 is projected onto the wafer 12 with the aid of the projection exposure apparatus 1. Here, the reticle 7 is illuminated by EUV radiation 14 in such a way that, as described, a chief ray of the EUV radiation 14 is incident on the reticle 7 at an angle of incidence CRA of at most 6° (e.g., at most 3°, at most 1°, 0°). For example, the angle of incidence CRA of the chief ray is less than the object-side numerical aperture (NAO), CRA<arcsin (NAO).

Finally, the light-sensitive layer on the wafer 12 that has been exposed with the illumination light is developed. A microstructured or nanostructured component part, such as a semiconductor chip, is produced in this way.

What is claimed is:

1. An imaging optical unit, comprising:
a plurality of mirrors configured to image an object field in an object plane into an image field in an image plane and, in so doing, to guide imaging light along an imaging light beam path,
wherein:
the plurality of mirrors comprises a grazing incidence mirror;
a first mirror in the imaging beam path is in an object plane mirror half space with respect to the object plane;
a last mirror in the imaging light beam path is in an image plane mirror half space with respect to the image plane;
the object plane mirror half space opens into an object plane mirror half space direction specified by a direction of a normal of the object plane emanating from the object plane, which normal extends into the object plane mirror half space;
the image plane mirror half space opens into an image plane mirror half space direction which is specified by a direction of a normal of the image plane emanating from the image plane, which normal extends into the image plane mirror half space; and
a half space direction angle between the object plane mirror half space direction and the image plane mirror half space direction is less than 30°.

2. The imaging optical unit of claim 1, wherein the object plane extends parallel to the image plane.

3. The imaging optical unit of claim 1, wherein a spatial distance between the object field and the image field is greater than 400 mm.

4. The imaging optical unit of claim 1, wherein, between the last mirror in the imaging light beam path and the image field, an imaging light beam section crosses at least two crossing imaging light beam sections between the first mirror in the imaging light beam path and a second-to-last mirror in the imaging light beam path.

5. The imaging optical unit of claim 4, wherein one of the crossing imaging light beam sections extends between a third-to-last mirror in the imaging light beam path and the second-to-last mirror in the imaging light beam path.

6. The imaging optical unit of claim 4, wherein one of the crossing imaging light beam sections extends between a sixth-to-last mirror in the imaging light beam path and a fifth-to-last mirror in the imaging light beam path.

7. The imaging optical unit of claim 4, wherein one of the crossing imaging light beam sections extends between a fourth-to-last mirror in the imaging light beam path and a third-to-last mirror in the imaging light beam path.

8. The imaging optical unit of claim 4, wherein one of the crossing imaging light beam sections extends b-tween a fifth-to-last mirror in the imaging light beam path and a fourth-to-last mirror in the imaging light beam path.

9. The imaging optical unit of claim 1, wherein the imaging optical unit has image-side numerical aperture greater than 0.7.

10. An optical system, comprising:
an illumination optical unit; and an imaging optical unit according to claim 1,
wherein the illumination optical unit is configured to illuminate the object field with illumination/imaging light.

11. The optical system of claim 10, wherein the illumination optical unit comprises no more than three mirrors which successively reflect the illumination light after a light source or after an intermediate focus downstream of said light source.

12. An apparatus, comprising:
a light source; and
an optical system, comprising:
an illumination optical unit; and
an imaging optical unit according to claim 1,
wherein the illumination optical unit is configured to illuminate the object field with illumination/imaging light, and apparatus is a projection exposure apparatus.

13. A method of using a projection exposure apparatus comprising an illumination optical unit and an imaging optical unit, the method comprising:
using the illumination optical unit to illuminate a section of a reticle; and
using the imaging optical unit to image the illuminated section of the reticle onto a light-sensitive coating, wherein the imaging optical unit is an imaging optical unit according to claim 1.

14. An imaging optical unit, comprising:
a plurality of mirrors configured to image an object field in an object plane into an image field in an image plane and, in so doing, to guide imaging light along an imaging light beam path,
wherein:
an imaging light beam section extends between the object field and a first mirror in the imaging light beam path at an angle with respect to a normal of the object plane of less than 3° ;
the first mirror in the imaging light beam path is in an object plane mirror half space with respect to the object plane;
a last mirror in the imaging light beam path is in an image plane mirror half space with respect to the image plane;
the object plane mirror half space opens into an object plane mirror half space direction specified by a direction of a normal of the object plane emanating from the object plane, which normal extends into the object plane mirror half space;
the image plane mirror half space opens into an image plane mirror half space direction specified by a direction of a normal of the image plane emanating from the image plane, which normal extends into the image plane mirror half space;
a half space direction angle between the object plane mirror half space direction and the image plane mirror half space direction is of less than 30° ; and
the imaging optical unit has an image-side numerical aperture greater than 0.6.

15. The imaging optical unit of claim 14, wherein the object plane extends parallel to the image plane.

16. The imaging optical unit of claim 14, wherein a spatial distance between the object field and the image field is greater than 400 mm.

17. The imaging optical unit of claim 14, wherein, between the last mirror in the imaging light beam path and the image field, an imaging light beam section crosses at least two crossing imaging light beam sections between the first mirror in the imaging light beam path and a second-to-last mirror in the imaging light beam path.

18. The imaging optical unit of claim 17, wherein one of the crossing imaging light beam sections extends between a third-to-last mirror in the imaging light beam path and the second-to-last mirror in the imaging light beam path.

19. The imaging optical unit of claim 17, wherein one of the crossing imaging light beam sections extends between a sixth-to-last mirror in the imaging light beam path and a fifth-to-last mirror in the imaging light beam path.

20. The imaging optical unit of claim 17, wherein one of the crossing imaging light beam sections extends between a fourth-to-last mirror in the imaging light beam path and a third-to-last mirror in the imaging light beam path.

* * * * *

UNITED STATES PATENT AND TRADEMARK OFFICE
CERTIFICATE OF CORRECTION

PATENT NO. : 11,422,470 B2
APPLICATION NO. : 16/933595
DATED : August 23, 2022
INVENTOR(S) : Johannes Ruoff and Hubert Holderer It is certified that error appears in the above-identified patent and that said Letters Patent is hereby corrected as shown below:

In the Specification

Column 8, Line 2, delete "de-scribed" insert -- described --.

Column 8, Line 7, delete "de-noted" insert -- denoted --.

Column 12, Line 18, delete "($P_x$," insert -- ($P_x$), --.

In the Claims

Column 22, Line 35, Claim 1, delete "30° ." insert -- 30°. --.

Column 23, Line 36, Claim 14, delete "3°." insert -- 3°; --.

Column 24, Line 13, Claim 14, delete "30°." insert -- 30°; --.

Signed and Sealed this
Eleventh Day of October, 2022

Katherine Kelly Vidal
*Director of the United States Patent and Trademark Office*